United States Patent [19]

Jeong

[11] Patent Number: 5,793,588
[45] Date of Patent: Aug. 11, 1998

[54] ELECTROSTATIC DISCHARGE PROTECTION CIRCUIT

[75] Inventor: Jae Goan Jeong, Ichon, Rep. of Korea

[73] Assignee: Hyundai Electronics Industries Co., Ltd., Kyoungki-do, Rep. of Korea

[21] Appl. No.: 780,180

[22] Filed: Dec. 26, 1996

[30] Foreign Application Priority Data

Dec. 29, 1995 [KR] Rep. of Korea ............. 95-66021

[51] Int. Cl.$^6$ ..................................... H02H 9/00
[52] U.S. Cl. ........................... 361/56; 361/91; 361/111
[58] Field of Search ........................ 361/56, 91, 111

[56] References Cited

U.S. PATENT DOCUMENTS

| | | | |
|---|---|---|---|
| 5,034,845 | 7/1991 | Murakami | 361/56 |
| 5,311,083 | 5/1994 | Wanlass | 326/68 |
| 5,343,352 | 8/1994 | Nagamine | 361/56 |
| 5,450,267 | 9/1995 | Diaz et al. | 361/56 |
| 5,515,232 | 5/1996 | Fukazawa et al. | 361/111 |

*Primary Examiner*—Jeffrey A. Gaffin
*Assistant Examiner*—Michael J. Sherry
*Attorney, Agent, or Firm*—Gary M. Nath; Nath & Associates

[57] ABSTRACT

A circuit for protecting against damage from an electrostatic discharge (ESD). The circuit provides protection by minimizing a voltage difference between a main voltage line and a TTL voltage line. This is accomplished with a bypass to a main ground voltage line in the case of a positive overvoltage, and a bypass to a main supply voltage line in the case of a negative overvoltage. In order to equalize the voltage between the main supply voltage line and the TTL supply voltage line, the circuit also utilizes a metal gate N-channel field transistor and a gate diode active transistor connected in parallel between the main and TTL supply voltage lines. A pair of metal gate N-channel field transistors is also connected in parallel between the main and TTL ground voltage lines in order to equalize the voltage between the main and TTL ground voltage lines.

18 Claims, 14 Drawing Sheets

5,793,588

ELECTROSTATIC DISCHARGE PROTECTION CIRCUIT

BACKGROUND OF THE INVENTION

1. Field of the Invention

The present invention relates in general to electrostatic discharge protection circuits, and more particularly to an electrostatic discharge protection circuit in which a gate diode NMOS transistor is provided between a main power line and a TTL power line to minimize a voltage difference between the two lines.

2. Description of the Prior Art

Generally, a metal oxide semiconductor (referred to hereinafter as MOS) transistor has a thin gate oxide film. As a result, if the MOS transistor is instantaneously applied with a large amount of positive (+) electrostatic charge or negative (−) electrostatic charge from the outside, the gate oxide film thereof is destroyed, resulting in a faulty operation of a semiconductor chip. For this reason, a circuit is provided at an input stage of one pin to discharge the positive (+) electrostatic charge or negative (−) electrostatic charge to the other pin when it is introduced from the outside to an internal circuit and a voltage level thereof is higher or lower than that desired by the internal circuit. Such a circuit is typically called an "electrostatic discharge (referred to hereinafter as ESD) circuit".

The reliability of the ESD circuit is essential to a semiconductor device and, thus, an ESD protection circuit has a considerably important effect on control/data pads of the semiconductor device. The representative reliability enhancing method is to divide a power line of supply voltage Vcc or ground voltage Vss and reduce noise on a specific portion of the power line. In other words, a main supply voltage (Vcc) line connected to the ESD protection circuit of the control/data pads is separated from a TTL Vcc line or quite Vcc line, and a main ground voltage (Vss) line connected to the ESD protection circuit of the control/data pads is separated from a TTL Vss line or quite Vss line. As a result of the power line separation, the main Vcc and Vss lines are protected to secure the ESD reliability. However, junctions of internal circuits between the main Vss line and TTL Vss line or quite Vss line, between the main Vcc line and TTL Vcc line or quite Vcc line and between the main Vcc line and TTL Vss line or quite Vss line may be destroyed due to the application of an ESD voltage, resulting in a damage in the internal circuits.

FIG. 1 is circuit diagram illustrating the construction of a conventional ESD protection circuit for a control pad, where the control pad is designated by the reference numeral 151. As shown in this drawing, the conventional ESD protection circuit comprises a main power line including a main supply voltage line 13 for transferring a supply voltage to a first internal circuit 11 and a main ground voltage line 14 for transferring a ground voltage to the first internal circuit 11, and an ESD protection part 15 including a first metal gate N-channel field transistor 152 connected to the main supply voltage line 13, a second metal gate N-channel field transistor 153 connected to the main ground voltage line 14, an $N^+$-diffused resistor Rs connected in series to the control pad 151, a first gate diode NMOS active transistor 154 connected between the $N^+$-diffused resistor Rs and the main ground voltage line 14 and a second gate diode NMOS active transistor 155 connected between the main supply voltage line 13 and the main ground voltage line 14. The conventional ESD protection circuit further comprises a TTL power line including a noise attenuation TTL supply voltage line 16 for transferring the supply voltage to a second internal circuit 12 and a noise attenuation TTL ground voltage line 17 for transferring the ground voltage to the second internal circuit 12.

In the above-mentioned conventional ESD protection circuit, any ESD protection part is not present between the TTL power line and the main power line. For this reason, when an ESD voltage is applied through the control pad 151, a voltage difference is present in a bipolar transistor 121 in the second internal circuit adjacent to the main power line, resulting in a damage in an $N^+$ source/drain junction thereof.

FIG. 2 is circuit diagram illustrating the construction of a conventional ESD protection circuit for a data pad, where the data pad is designated by the reference numeral 251. The construction of this drawing is substantially the same as that of FIG. 1, with the exception that a pull-up NMOS transistor 252 and a pull-down NMOS transistor 253 are provided in an ESD protection part 25. As a result, the conventional ESD protection circuit of FIG. 2 has the same disadvantage as that of the conventional ESD protection circuit of FIG. 1.

SUMMARY OF THE INVENTION

Therefore, the present invention has been made in view of the above problem, and it is an object of the present invention to provide an ESD protection circuit which is capable of minimizing a voltage difference between a main power line and a TTL power line to prevent a source/drain junction from being damaged when an ESD voltage is applied.

In accordance with one aspect of the present invention, there is provided an electrostatic discharge protection circuit comprising a control pad; first bypass means for bypassing a positive overvoltage from the control pad to a first ground voltage source; second bypass means for bypassing a negative overvoltage from the control pad to a first supply voltage source; first voltage equalization means for equalizing a voltage between the first supply voltage source and a second supply voltage source; and second voltage equalization means for equalizing a voltage between the first ground voltage source and a second ground voltage source.

In accordance with another aspect of the present invention, there is provided an electrostatic discharge protection circuit comprising a data pad; first bypass means for bypassing a positive overvoltage from the data pad to a first ground voltage source; second bypass means for bypassing a negative overvoltage from the data pad to a first supply voltage source; first voltage equalization means for equalizing a voltage between the first supply voltage source and a second supply voltage source; and second voltage equalization means for equalizing a voltage between the first ground voltage source and a second ground voltage source.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
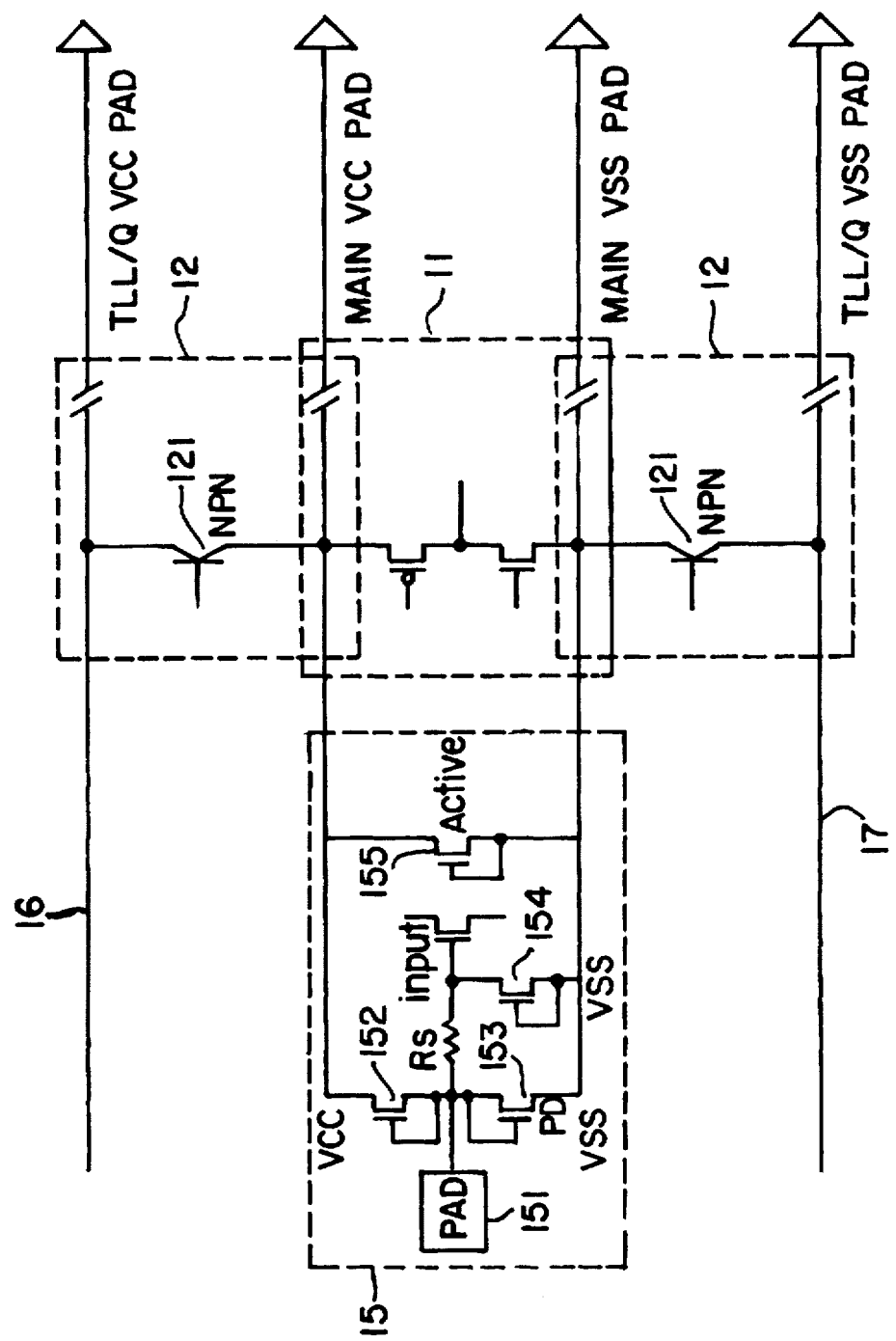
FIG. 1 is circuit diagram illustrating the construction of a conventional ESD protection circuit for a control pad.
Figure 2:
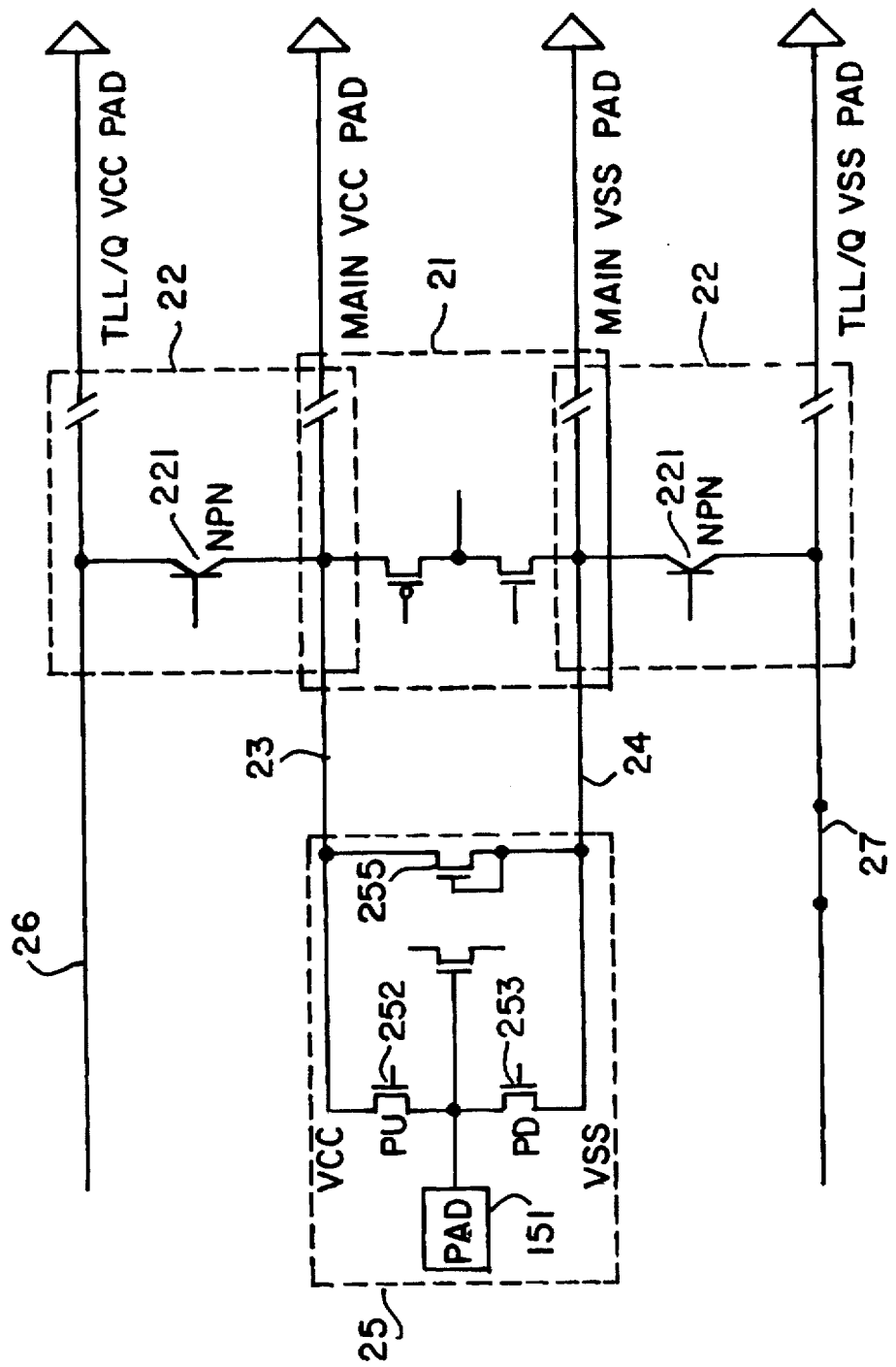
FIG. 2 is circuit diagram illustrating the construction of a conventional ESD protection circuit for a data pad.
Figure 3:
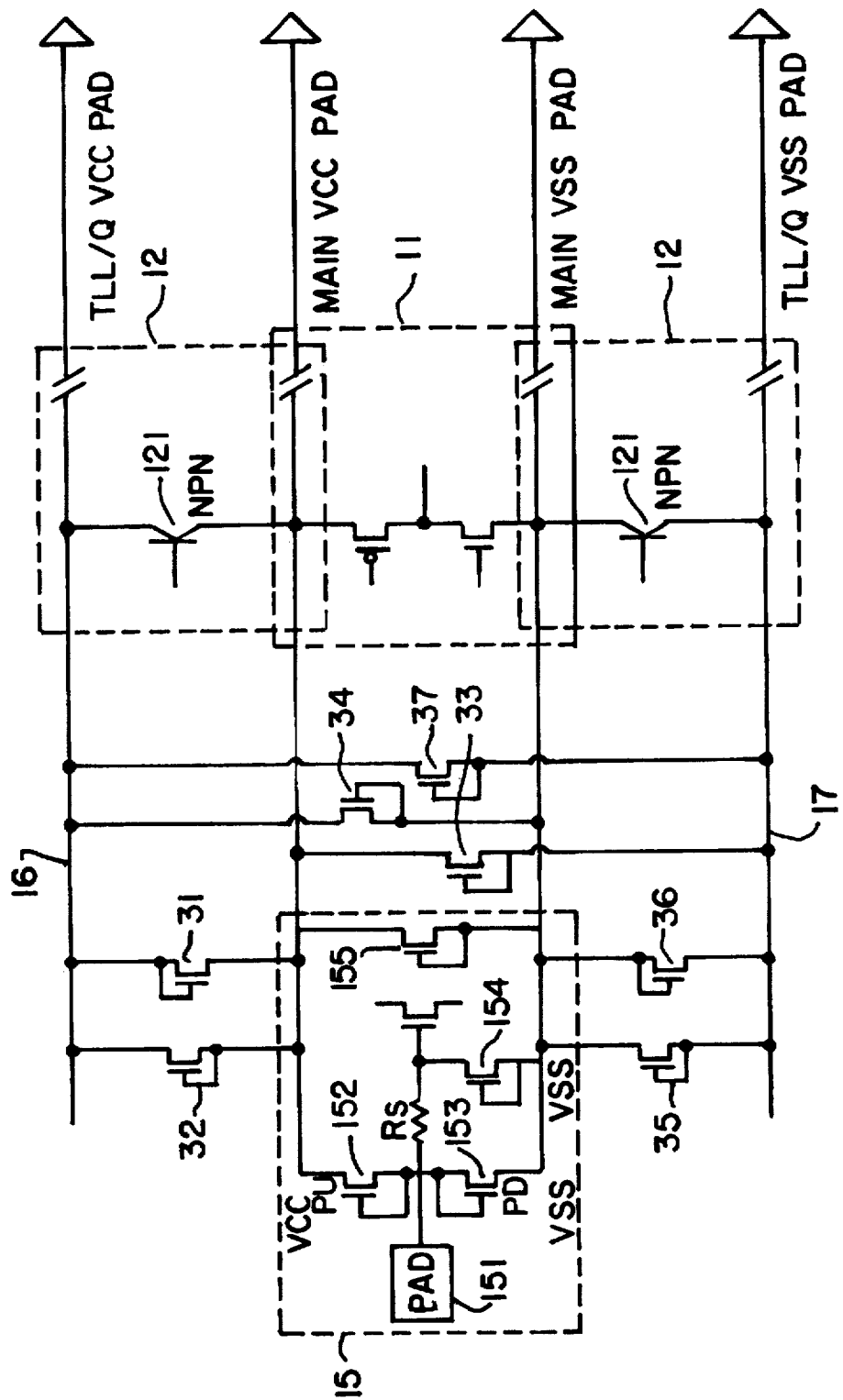
FIGS. 3 to 9 are circuit diagrams illustrating first to seventh embodiments of an ESD protection circuit for a control pad in accordance with the present invention, respectively.

FIG. 3 is a circuit diagram illustrating a first embodiment of an ESD protection circuit for a control pad in accordance with the present invention, where the control pad is designated by the reference numeral 151. As shown in this drawing, the ESD protection circuit comprises an ESD protection part 15 including a main supply voltage line 13 for transferring a main supply voltage to a first internal circuit 11, a main ground voltage line 14 for transferring a main ground voltage to the first internal circuit 11, a first metal gate N-channel field transistor 152 connected to the main supply voltage line 13, a second metal gate N-channel field transistor 153 connected to the main ground voltage line 14, an $N^+$-diffused resistor Rs connected in series to the control pad 151, a first gate diode NMOS active transistor 154 connected between the $N^+$-diffused resistor Rs and the main ground voltage line 14, and a second gate diode NMOS active transistor 155 connected between the main supply voltage line 13 and the main ground voltage line 14.

The ESD protection circuit further comprises a noise attenuation TTL supply voltage line 16 for transferring a TTL supply voltage to a second internal circuit 12, a noise attenuation TTL ground voltage line 17 for transferring a TTL ground voltage to the second internal circuit 12, a third metal gate N-channel field transistor 31 and a third gate diode NMOS active transistor 32 connected in parallel between the main supply voltage line 13 and the TTL supply voltage line 16, for controlling a voltage difference between the main supply voltage line 13 and the TTL supply voltage line 16 in such a manner that it can have a desired level, a fourth metal gate N-channel field transistor 33 connected between the main supply voltage line 13 and the TTL ground voltage line 17, for controlling a voltage difference between the main supply voltage line 13 and the TTL ground voltage line 17 in such a manner that it can have a desired level, a fifth metal gate N-channel field transistor 34 connected between the main ground voltage line 14 and the TTL supply voltage line 16, for controlling a voltage difference between the main ground voltage line 14 and the TTL supply voltage line 16 in such a manner that it can have a desired level, sixth and seventh metal gate N-channel field transistors 35 and 36 connected in parallel between the main ground voltage line 14 and the TTL ground voltage line 17, for controlling a voltage difference between the main ground voltage line 14 and the TTL ground voltage line 17 in such a manner that it can have a desired level, and an eight metal gate N-channel field transistor 37 connected between the TTL supply voltage line 16 and the TTL ground voltage line 17, for controlling a voltage difference between the TTL supply voltage line 16 and the TTL ground voltage line 17 in such a manner that it can have a desired level.

The operation of the ESD protection circuit with the abovementioned construction in accordance with the present invention will hereinafter be described in detail.

If an ESD voltage is applied through the control pad 151, the third metal gate N-channel field transistor 31 and the third gate diode NMOS active transistor 32 are turned on to control the voltage difference between the main supply voltage line 13 and the TTL supply voltage line 16 in such a manner that it can have a desired level. Also, the fourth metal gate N-channel field transistor 33 is turned on to control the voltage difference between the main supply voltage line 13 and the TTL ground voltage line 17 in such a manner that it can have a desired level. Also, the fifth metal gate N-channel field transistor 34 is turned on to control the voltage difference between the main ground voltage line 14 and the TTL supply voltage line 16 in such a manner that it can have a desired level. Further, the sixth and seventh metal gate N-channel field transistors 35 and 36 are turned on to control the voltage difference between the main ground voltage line 14 and the TTL ground voltage line 17 in such a manner that it can have a desired level. Further, the eight metal gate N-channel field transistor 37 is turned on to control the voltage difference between the TTL supply voltage line 16 and the TTL ground voltage line 17 in such a manner that it can have a desired level. As a result, the voltage differences are reduced and current is dispersed, so that the second internal circuit 12 as well as the first internal circuit 11 can be prevented from being damaged. Therefore, the ESD characteristic is enhanced.

Figure 4:
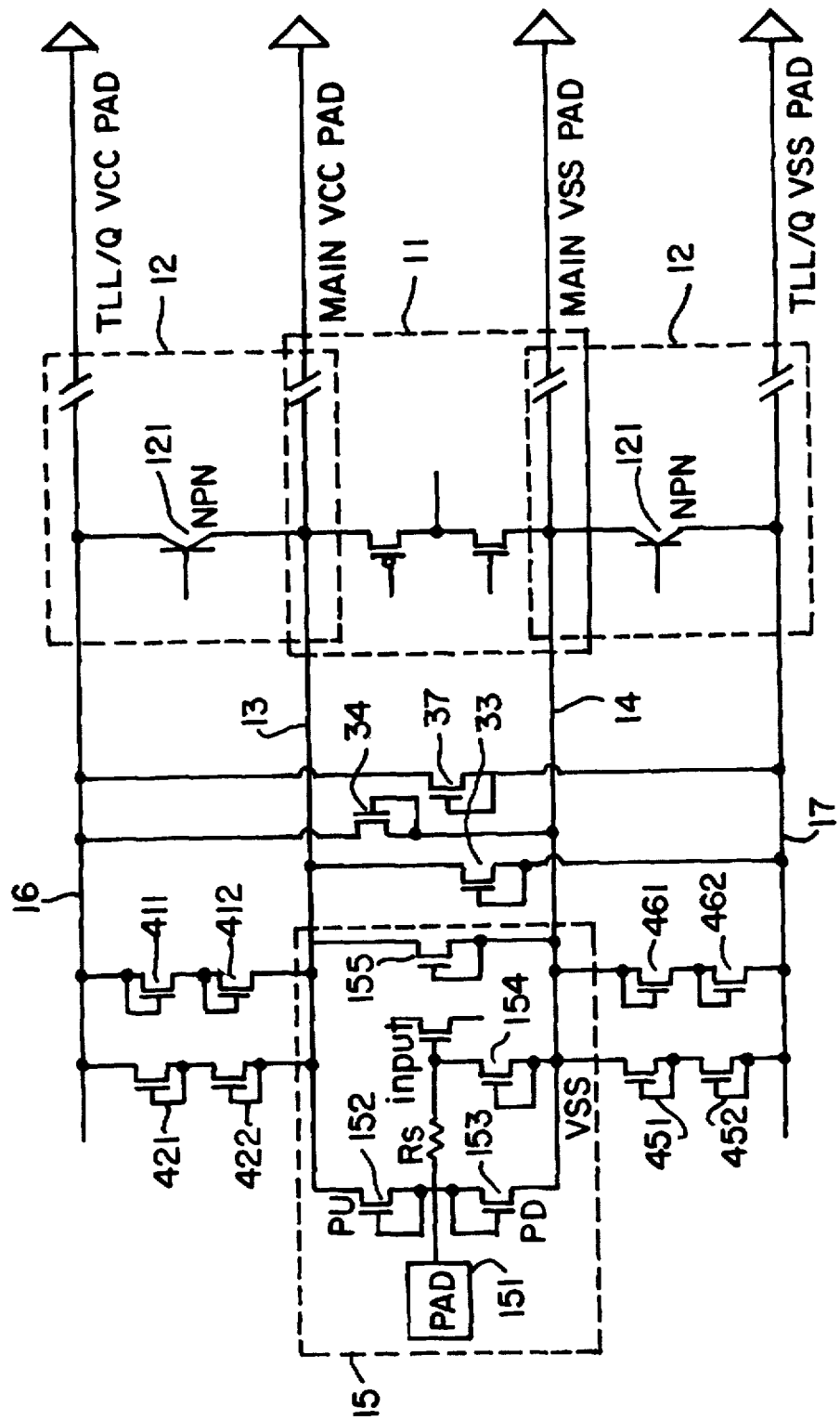

FIG. 4 is a circuit diagram illustrating a second embodiment of the ESD protection circuit for the control pad in accordance with the present invention. As shown in this drawing, the construction of the second embodiment is the same as that of the first embodiment in FIG. 3, with the exception that ninth and tenth metal gate N-channel field transistors 411 and 412 are connected in series between the main supply voltage line 13 and the TTL supply voltage line 16 instead of the third metal gate N-channel field transistor 31, fourth and fifth gate diode NMOS active transistors 421 and 422 are connected in series between the main supply voltage line 13 and the TTL supply voltage line 16 instead of the third gate diode NMOS active transistor 32, eleventh and twelfth metal gate N-channel field transistors 451 and 452 are connected in series between the main ground voltage line 14 and the TTL ground voltage line 17 instead of the sixth metal gate N-channel field transistor 35, and thirteenth and fourteenth metal gate N-channel field transistors 461 and 462 are connected in series between the main ground voltage line 14 and the TTL ground voltage line 17 instead of the seventh metal gate N-channel field transistor 36. With this construction, the second embodiment reduces noise between the main power line and the TTL power line using two threshold voltages. Therefore, the second embodiment satisfies the noise problem and ESD protection together.

Figure 5:
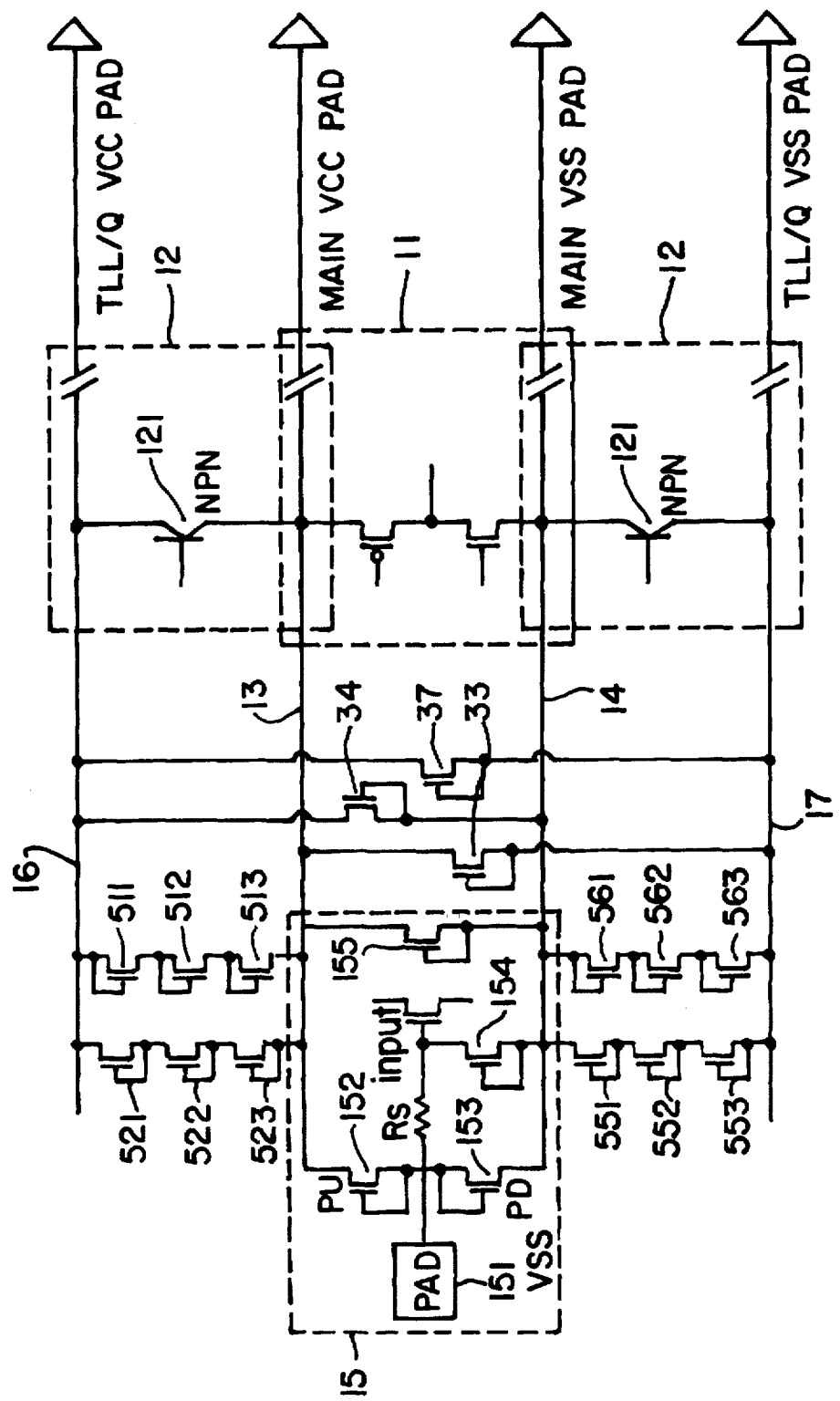

FIG. 5 is a circuit diagram illustrating a third embodiment of the ESD protection circuit for the control pad in accordance with the present invention. As shown in this drawing, the construction of the third embodiment is the same as that of the first embodiment in FIG. 3, with the exception that fifteenth to seventeenth metal gate N-channel field transistors 511–513 are connected in series between the main supply voltage line 13 and the TTL supply voltage line 16 instead of the third metal gate N-channel field transistor 31, sixth to eighth gate diode NMOS active transistors 521–523 are connected in series between the main supply voltage line 13 and the TTL supply voltage line 16 instead of the third gate diode NMOS active transistor 32, eighteenth to twentieth metal gate N-channel field transistors 551–553 are connected in series between the main ground voltage line 14 and the TTL ground voltage line 17 instead of the sixth metal gate N-channel field transistor 35, and twenty-first to twenty-third metal gate N-channel field transistors 561–563 are connected in series between the main ground voltage line 14 and the TTL ground voltage line 17 instead of the seventh metal gate N-channel field transistor 36. With this construction, the third embodiment reduces noise between the main power line and the TTL power line using three threshold voltages. Therefore, the third embodiment satisfies the noise problem and ESD protection together.

Figure 6:
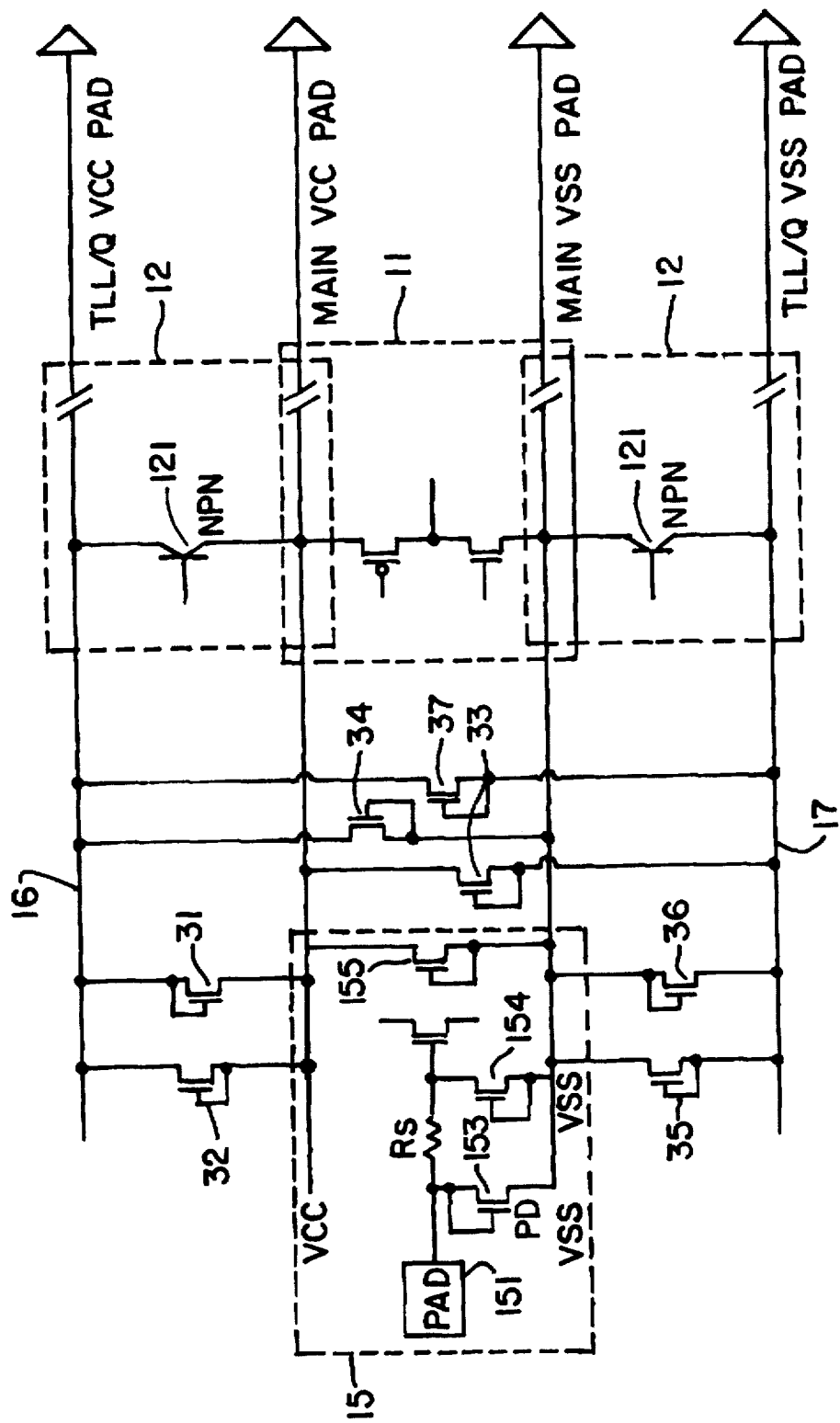

FIG. 6 is a circuit diagram illustrating a fourth embodiment of the ESD protection circuit for the control pad in accordance with the present invention. As shown in this drawing, the construction of the fourth embodiment is the same as that of the first embodiment in FIG. 3, with the exception that the first metal gate N-channel field transistor 152 connected to the main supply voltage line 13 is removed.

Figure 7:
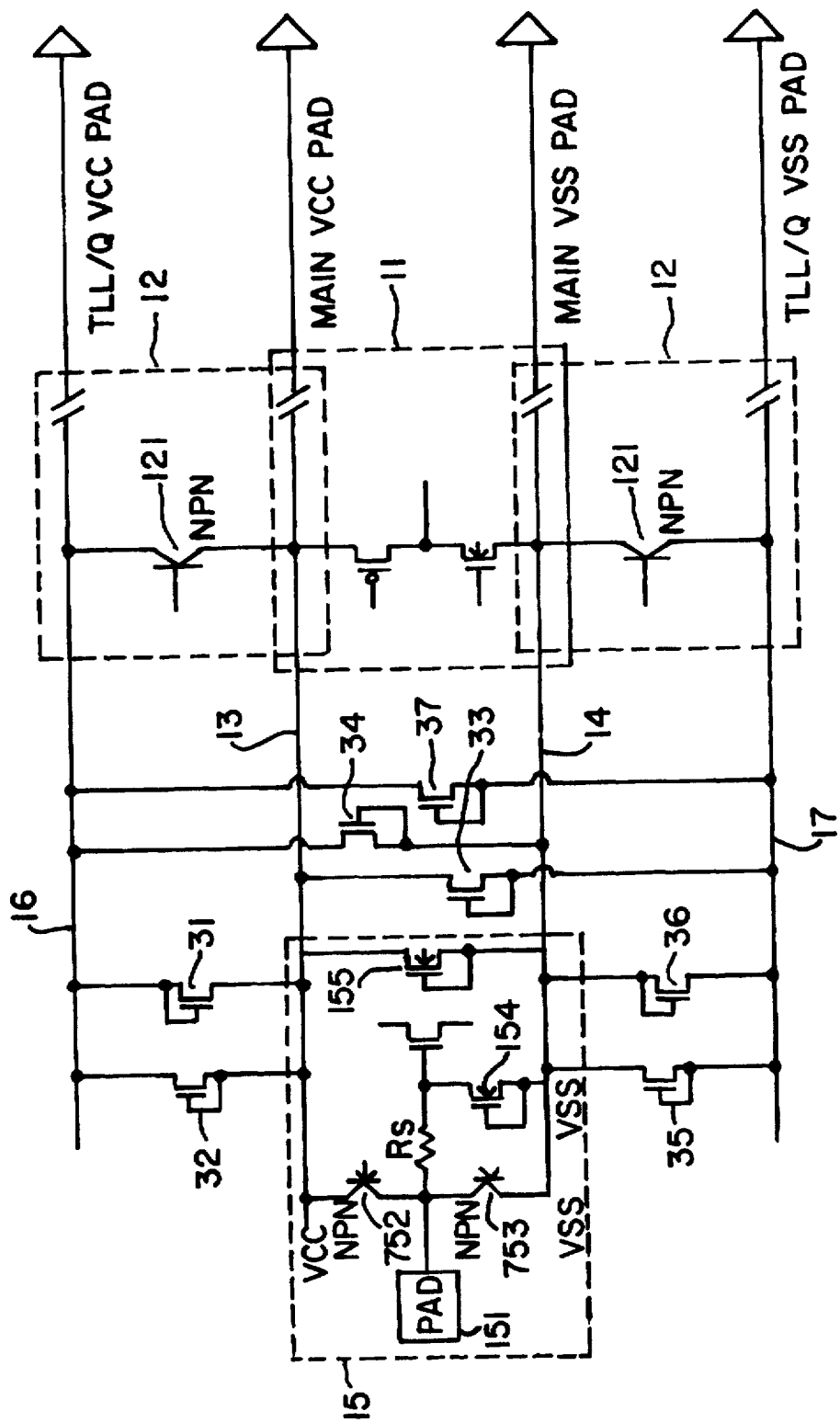

FIG. 7 is a circuit diagram illustrating a fifth embodiment of the ESD protection circuit for the control pad in accordance with the present invention. As shown in this drawing, the construction of the fifth embodiment is the same as that of the first embodiment in FIG. 3, with the exception that a first NPN-type bipolar transistor 752 is connected to the main supply voltage line 13 instead of the first metal gate N-channel field transistor 152, and a second NPN-type bipolar transistor 753 is connected to the main ground voltage line 14 instead of the second metal gate N-channel field transistor 153.

Figure 8:
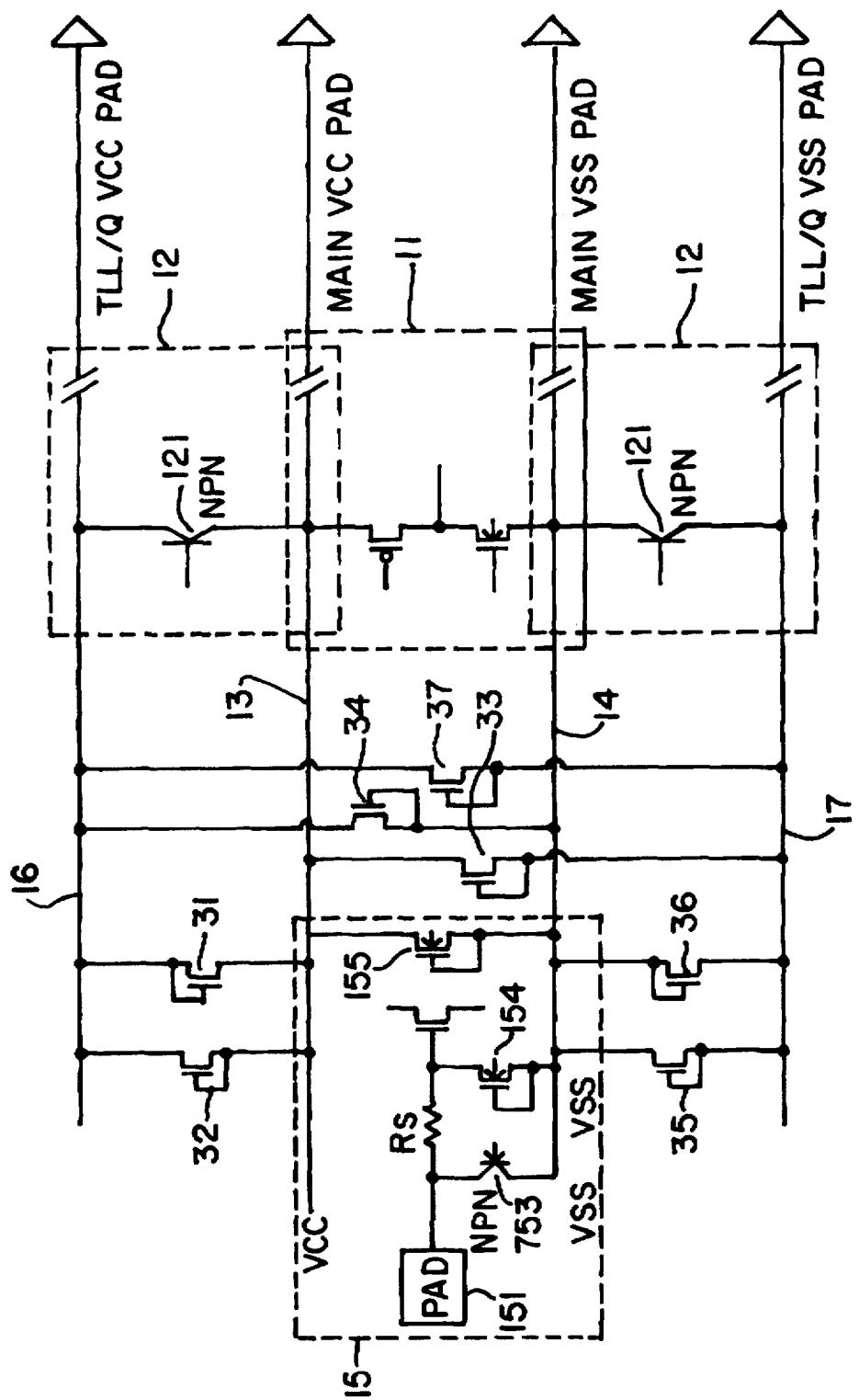

FIG. 8 is a circuit diagram illustrating a sixth embodiment of the ESD protection circuit for the control pad in accordance with the present invention. As shown in this drawing, the construction of the sixth embodiment is the same as that of the fifth embodiment in FIG. 7, with the exception that the first NPN-type bipolar transistor 752 connected to the main supply voltage line 13 is removed.

Figure 9:
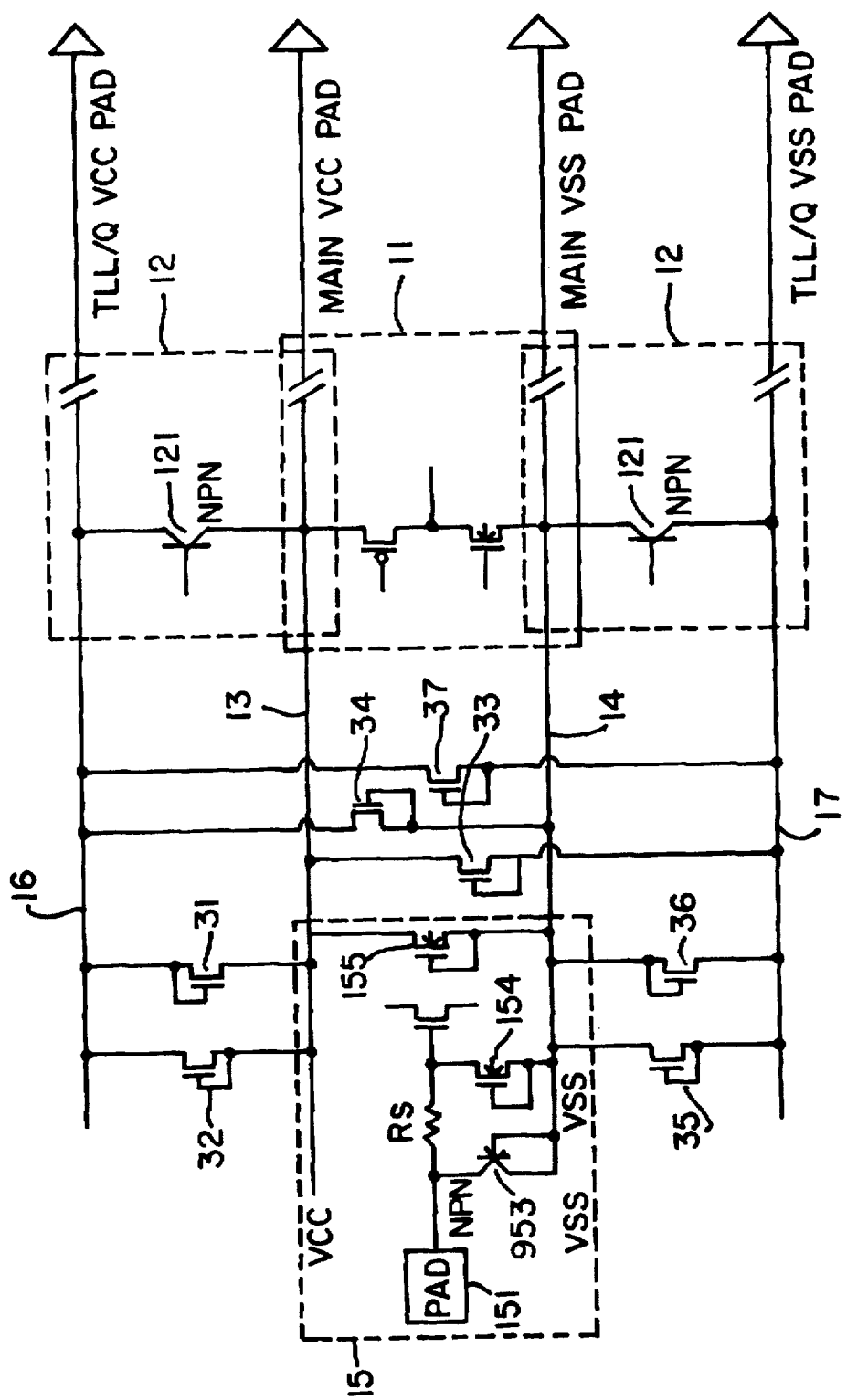

FIG. 9 is a circuit diagram illustrating a seventh embodiment of the ESD protection circuit for the control pad in accordance with the present invention. As shown in this drawing, the construction of the seventh embodiment is the same as that of the sixth embodiment in FIG. 8, with the exception that a third NPN-type bipolar transistor 953 is connected to the main ground voltage line 14 instead of the second NPN-type bipolar transistor 753. The third NPN-type bipolar transistor 953 has its base connected to the main ground voltage line 14.

Figure 10:
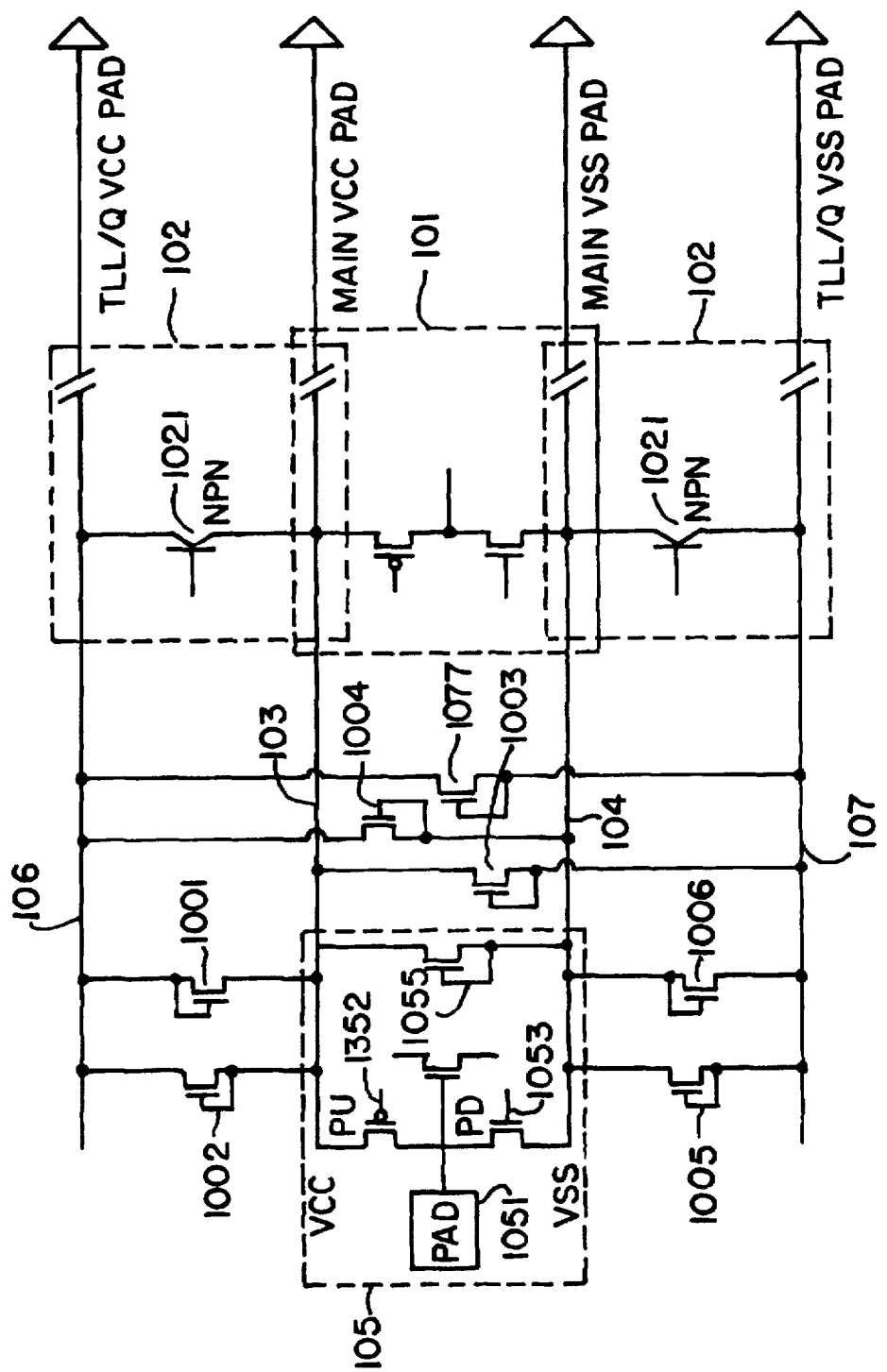
FIGS. 10 to 13 are circuit diagrams illustrating first to fourth embodiments of an ESD protection circuit for a data pad in accordance with the present invention, respectively.

FIG. 10 is a circuit diagram illustrating a first embodiment of an ESD protection circuit for a data pad in accordance with the present invention, where the data pad is designated by the reference numeral 1051. As shown in this drawing, the ESD protection circuit comprises an ESD protection part 105 including a main supply voltage line 103 for transferring a main supply voltage to a first internal circuit 101, a main ground voltage line 104 for transferring a main ground voltage to the first internal circuit 101, a pull-up NMOS transistor 1052 connected to the main supply voltage line 103, a pull-down NMOS transistor 1053 connected to the main ground voltage line 104, and a first gate diode NMOS active transistor 1055 connected between the main supply voltage line 103 and the main ground voltage line 104.

The ESD protection circuit further comprises a noise attenuation TTL supply voltage line 106 for transferring a TTL supply voltage to a second internal circuit 102, a noise attenuation TTL ground voltage line 107 for transferring a TTL ground voltage to the second internal circuit 102, a first metal gate N-channel field transistor 1001 and a second gate diode NMOS active transistor 1002 connected in parallel between the main supply voltage line 103 and the TTL supply voltage line 106, for controlling a voltage difference between the main supply voltage line 103 and the TTL supply voltage line 106 in such a manner that it can have a desired level, a second metal gate N-channel field transistor 1003 connected between the main supply voltage line 103 and the TTL ground voltage line 107, for controlling a voltage difference between the main supply voltage line 103 and the TTL ground voltage line 107 in such a manner that it can have a desired level, a third metal gate N-channel field transistor 1004 connected between the main ground voltage line 104 and the TTL supply voltage line 106, for controlling a voltage difference between the main ground voltage line 104 and the TTL supply voltage line 106 in such a manner that it can have a desired level, fourth and fifth metal gate N-channel field transistors 1005 and 1006 connected in parallel between the main ground voltage line 104 and the TTL ground voltage line 107, for controlling a voltage difference between the main ground voltage line 104 and the TTL ground voltage line 107 in such a manner that it can have a desired level, and a sixth metal gate N-channel field transistor 1007 connected between the TTL supply voltage line 106 and the TTL ground voltage line 107, for controlling a voltage difference between the TTL supply voltage line 106 and the TTL ground voltage line 107 in such a manner that it can have a desired level.

Figure 11:
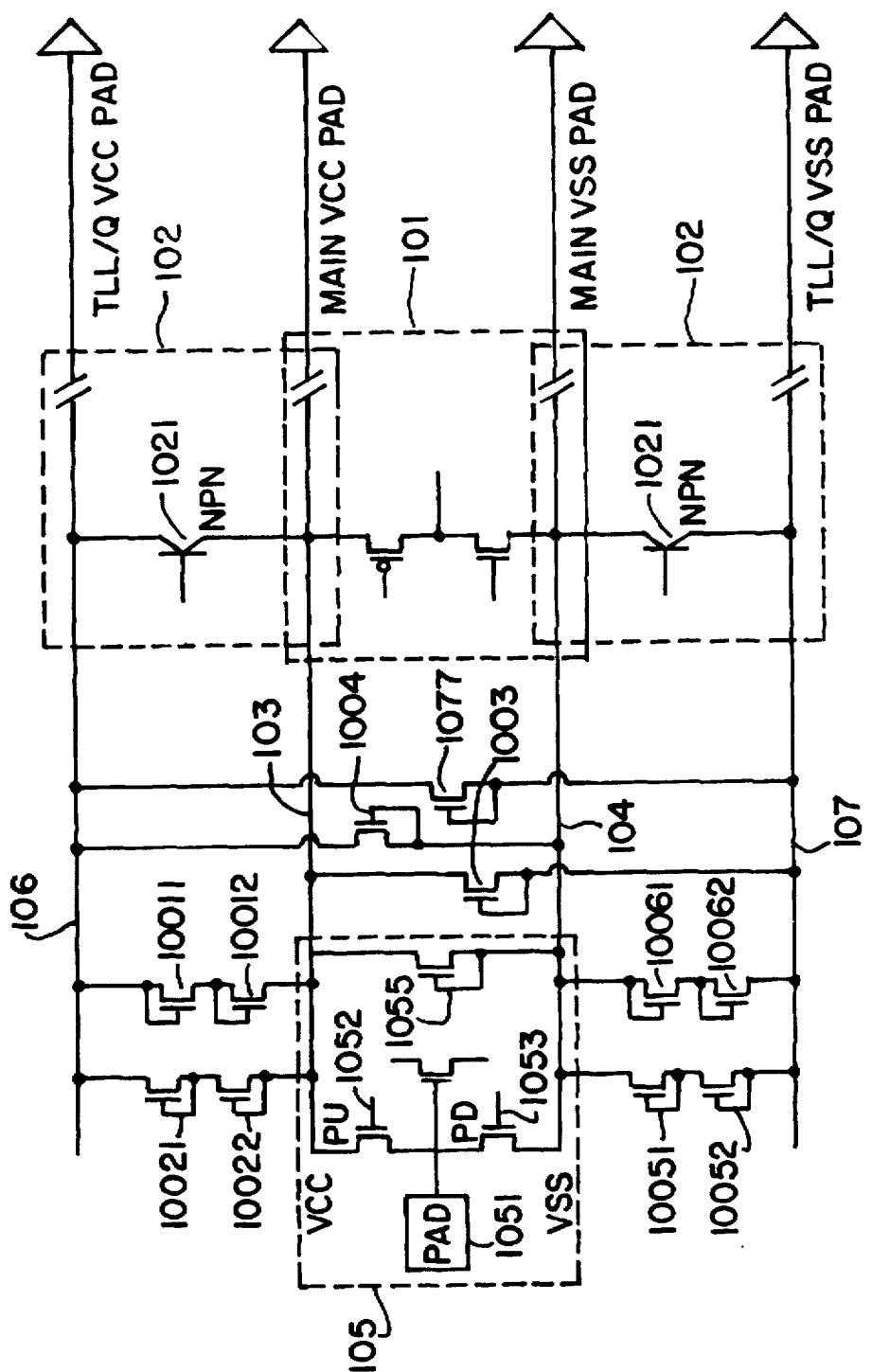

FIG. 11 is a circuit diagram illustrating a second embodiment of the ESD protection circuit for the data pad in accordance with the present invention. As shown in this drawing, the construction of the second embodiment is the same as that of the first embodiment in FIG. 10, with the exception that seventh and eighth metal gate N-channel field transistors 10011 and 10012 are connected in series between the main supply voltage line 103 and the TTL supply voltage line 106 instead of the first metal gate N-channel field transistor 1001, third and fourth gate diode NMOS active transistors 10021 and 10022 are connected in series between the main supply voltage line 103 and the TTL supply voltage line 106 instead of the second gate diode NMOS active transistor 1002, ninth and tenth metal gate N-channel field transistors 10051 and 10052 are connected in series between the main ground voltage line 104 and the TTL ground voltage line 107 instead of the fourth metal gate N-channel field transistor 1005, and eleventh and twelfth metal gate N-channel field transistors 10061 and 10062 are connected in series between the main ground voltage line 104 and the TTL ground voltage line 107 instead of the fifth metal gate N-channel field transistor 1006. With this construction, the second embodiment reduces noise between the main power line and the TTL power line using two threshold voltages. Therefore, the second embodiment satisfies the noise problem and ESD protection together.

Figure 12:
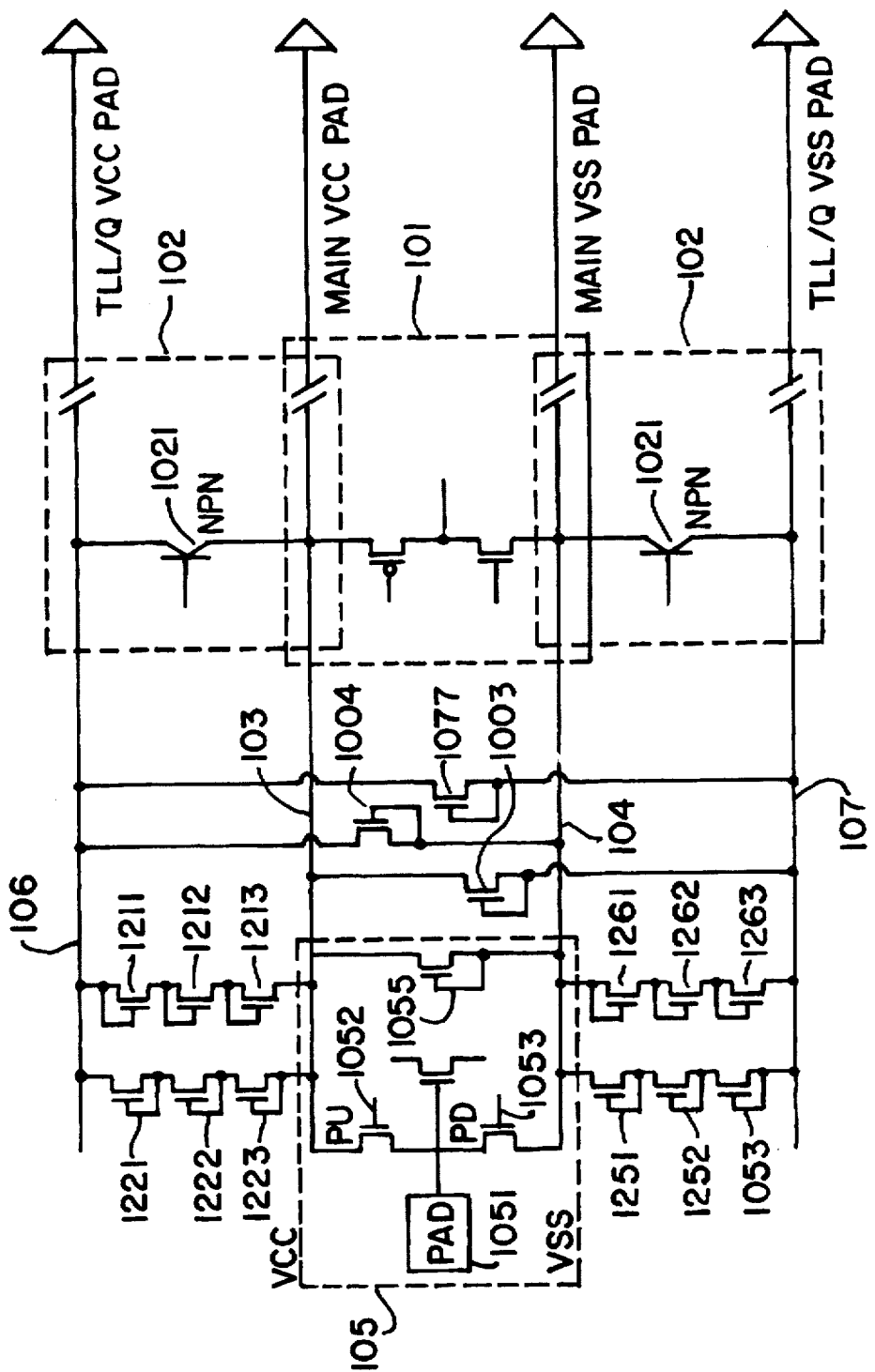

FIG. 12 is a circuit diagram illustrating a third embodiment of the ESD protection circuit for the data pad in accordance with the present invention. As shown in this drawing, the construction of the third embodiment is the same as that of the first embodiment in FIG. 10, with the exception that thirteenth to fifteenth metal gate N-channel field transistors 1211–1213 are connected in series between the main supply voltage line 103 and the TTL supply voltage line 106 instead of the first metal gate N-channel field transistor 1001, fifth to seventh gate diode NMOS active transistors 1221–1223 are connected in series between the main supply voltage line 103 and the TTL supply voltage line 106 instead of the second gate diode NMOS active transistor 1002, sixteenth to eighteenth metal gate N-channel field transistors 1251–1253 are connected in series between the main ground voltage line 104 and the TTL ground voltage line 107 instead of the fourth metal gate N-channel field transistor 1005, and nineteenth to twenty-first metal gate N-channel field transistors 1261–1263 are connected in series between the main ground voltage line 104 and the TTL ground voltage line 107 instead of the fifth metal gate N-channel field transistor 1006. With this construction, the third embodiment reduces noise between the main power line and the TTL power line using three threshold voltages. Therefore, the third embodiment satisfies the noise problem and ESD protection together.

Figure 13:
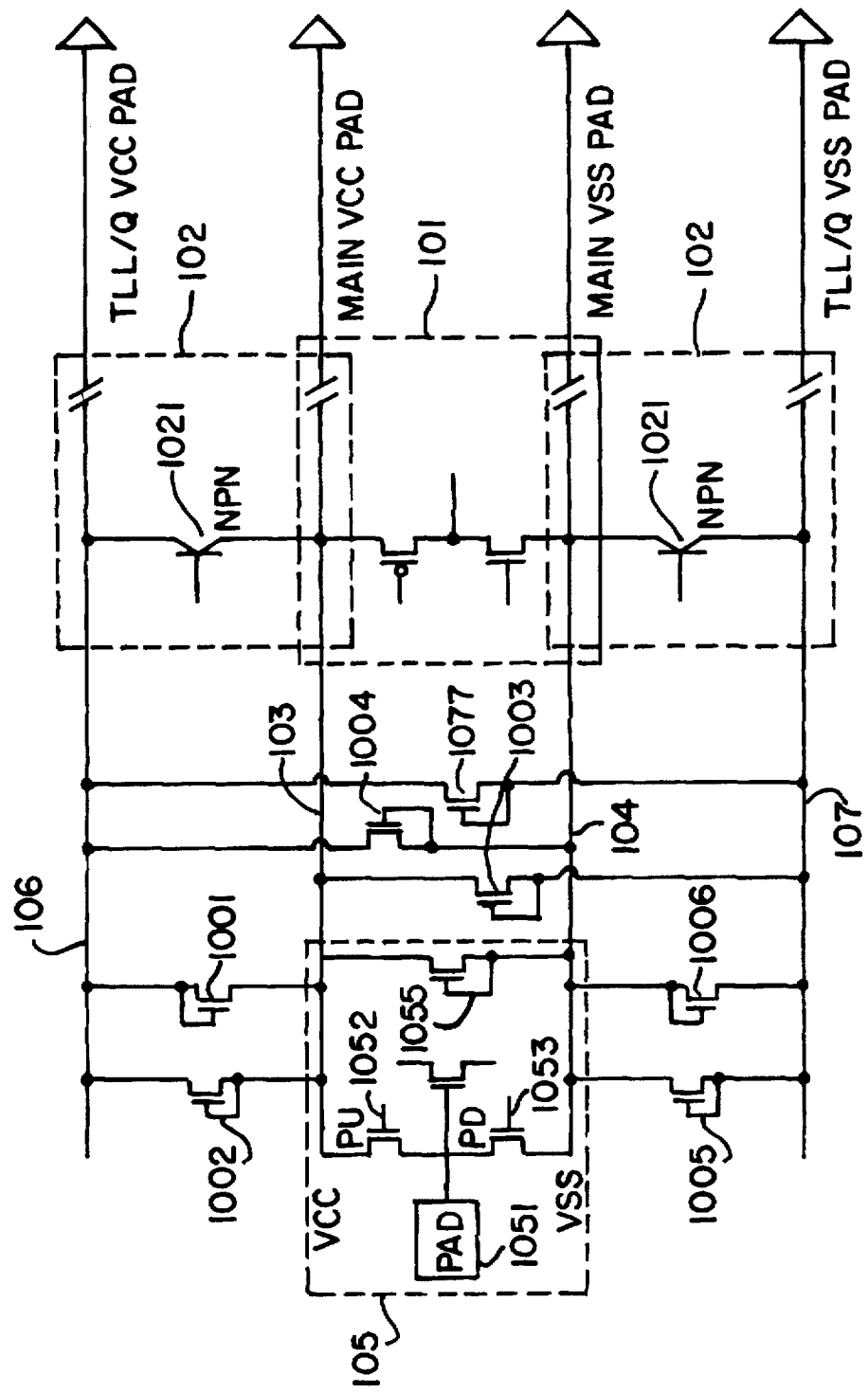

FIG. 13 is a circuit diagram illustrating a fourth embodiment of the ESD protection circuit for the data pad in accordance with the present invention. As shown in this drawing, the construction of the fourth embodiment is the same as that of the first embodiment in FIG. 10, with the exception that a pull-up PMOS transistor 1352 is connected to the main supply voltage line 103 instead of the pull-up NMOS transistor 1052.

Figure 14:
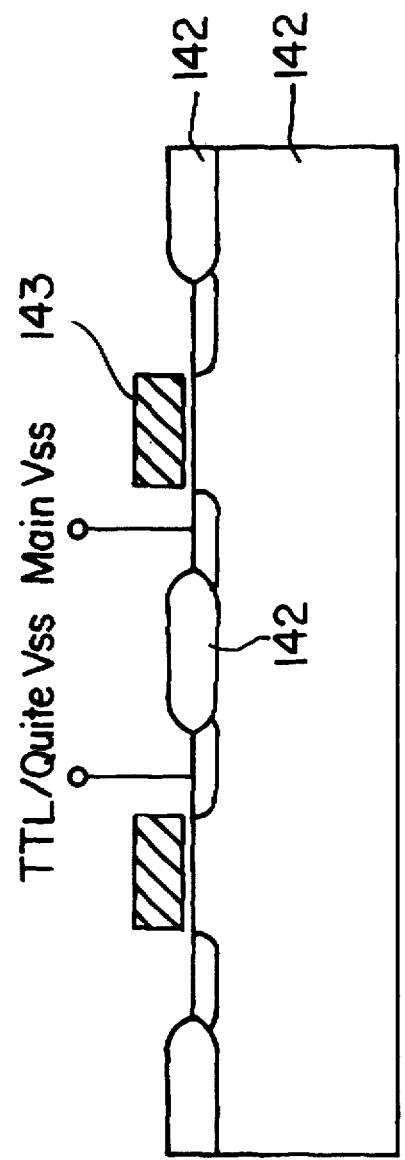
FIG. 14 is a sectional view of a bipolar transistor in FIG. 10.

FIG. 14 is a sectional view of a bipolar transistor 1021 in the second internal circuit 102 in FIG. 10. In this drawing, the reference numeral 141 designates a well on a silicon substrate, 142 designates an insulating film, 143 designates a gate electrode, and 144 designates a source/drain operating region. As shown in this drawing, the main power line and the TTL power line are separated from each other to avoid noise, and an NPN transistor is formed in a circuit adjacent to the main power line and TTL power line.

As apparent from the above description, according to the present invention, when the ESD voltage is applied, the ESD protection circuit reduces the voltage difference between the main power line and TTL power line and disperses the current. Therefore, the ESD protection circuit of the present invention has the effect of enhancing the ESD reliability and preventing the internal circuit from being damaged.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An electrostatic discharge protection circuit comprising:
    a control pad;
    first bypass means for bypassing a positive overvoltage from said control pad to a first ground voltage source;
    second bypass means for bypassing a negative overvoltage from said control pad to a first supply voltage source;
    first voltage equalization means for equalizing a voltage between said first supply voltage source and a second supply voltage source wherein said first voltage equalization means includes one metal gate N-channel field transistor and one date diode NMOS active transistor connected in parallel between said first and second supply voltage sources; and
    second voltage equalization means for equalizing a voltage between said first ground voltage source and a second ground voltage source wherein said second voltage equalization means includes a pair of metal gate N-channel field transistors connected in parallel between said first and second ground voltage sources.

2. An electrostatic discharge protection circuit as set forth in claim 1, wherein said first voltage equalization means further includes two metal gate N-channel field transistors and two gate diode NMOS active transistors connected in parallel between said first and second supply voltage sources.

3. An electrostatic discharge protection circuit as set forth in claim 1, wherein said first voltage equalization means further includes three metal gate N-channel field transistors and three gate diode NMOS active transistors connected in parallel between said first and second supply voltage sources.

4. An electrostatic discharge protection circuit as set forth in claim 1, wherein said second voltage equalization means further includes two pairs of metal gate N-channel field transistors connected in parallel between said first and second ground voltage sources.

5. An electrostatic discharge protection circuit as set forth in claim 1, wherein said second voltage equalization means further includes three pairs of metal gate N-channel field transistors connected in parallel between said first and second ground voltage sources.

6. An electrostatic discharge protection circuit as set forth in claim 1, further comprising:
    third voltage equalization means for equalizing a voltage between said first supply voltage source and said second ground voltage source;
    fourth voltage equalization means for equalizing a voltage between said first ground voltage source and said second supply voltage source; and
    fifth voltage equalization means for equalizing a voltage between said second supply voltage source and said second ground voltage source.

7. An electrostatic discharge protection circuit as set forth in claim 8, wherein said third voltage equalization means includes a metal gate N-channel field transistor connected between said first supply voltage source and said second ground voltage source.

8. An electrostatic discharge protection circuit as set forth in claim 8, wherein said fourth voltage equalization means includes a metal gate N-channel field transistor connected between said first ground voltage source and said second supply voltage source.

9. An electrostatic discharge protection circuit as set forth in claim 6, wherein said fifth voltage equalization means further includes a metal gate N-channel field transistor connected between said second supply voltage source and said second ground voltage source.

10. An electrostatic discharge protection circuit comprising:
    a data pad;
    first bypass means for bypassing a positive overvoltage from said data pad to a first ground voltage source;
    second bypass means for bypassing a negative overvoltage from said data pad to a first supply voltage source;
    first voltage equalization means for equalizing a voltage between said first supply voltage source and a second supply voltage source wherein said first voltage equalization means includes one metal gate N-channel field transistor and one gate diode NMOS active transistor connected in parallel between said first and second supply voltage sources; and
    second voltage equalization means for equalizing a voltage between said first ground voltage source and a second ground voltage source wherein said second voltage equalization means includes a pair of metal gate N-channel field transistors connected in parallel between said first and second around voltage sources.

11. An electrostatic discharge protection circuit as set forth in claim 10, wherein said first voltage equalization means further includes two metal gate N-channel field transistors and two gate diode NMOS active transistors connected in parallel between said first and second supply voltage sources.

12. An electrostatic discharge protection circuit as set forth in claim 10, wherein said first voltage equalization means further includes three metal gate N-channel field transistors and three gate diode NMOS active transistors connected in parallel between said first and second supply voltage sources.

13. An electrostatic discharge protection circuit as set forth in claim 10, wherein said second voltage equalization means further includes two pairs of metal gate N-channel field transistors connected in parallel between said first and second ground voltage sources.

14. An electrostatic discharge protection circuit as set forth in claim 10, wherein said second voltage equalization means further includes three pairs of metal gate N-channel field transistors connected in parallel between said first and second ground voltage sources.

15. An electrostatic discharge protection circuit as set forth in claim 10, further comprising:

third voltage equalization means for equalizing a voltage between said first supply voltage source and said second ground voltage source;

fourth voltage equalization means for equalizing a voltage between said first ground voltage source and said second supply voltage source; and fifth voltage equalization means for equalizing a voltage between said second supply voltage source and said second ground voltage source.

16. An electrostatic discharge protection circuit as set forth in claim 15, wherein said third voltage equalization means includes a metal gate N-channel field transistor connected between said first supply voltage source and said second ground voltage source.

17. An electrostatic discharge protection circuit as set forth in claim 15, wherein said fourth voltage equalization means includes a metal gate N-channel field transistor connected between said first ground voltage source and said second supply voltage source.

18. An electrostatic discharge protection circuit as set forth in claim 15, wherein said fifth voltage equalization means includes a metal gate N-channel field transistor connected between said second supply voltage source and said second ground voltage source.

* * * * *

UNITED STATES PATENT AND TRADEMARK OFFICE
CERTIFICATE OF CORRECTION

PATENT NO.  : 5,793,588
DATED       : August 11, 1998
INVENTOR(S) : Jae Goan JEONG It is certified that error appears in the above-identified patent and that said Letters Patent is hereby corrected as shown below:

Claim 7, line 2, replace "claim 8" with --claim 6--.

Claim 8, line 2, replace "claim 8" with --claim 6--.

Claim 10, line 20, replace "around" with --ground--.

Signed and Sealed this

Fifteenth Day of December, 1998

Attest:

BRUCE LEHMAN

Attesting Officer

Commissioner of Patents and Trademarks